United States Patent
Breton et al.

(10) Patent No.: US 7,589,988 B2
(45) Date of Patent: Sep. 15, 2009

(54) FAST ANALOG SAMPLER FOR CONTINUOUS RECORDING AND READ-OUT AND DIGITAL CONVERSION SYSTEM

(75) Inventors: Dominique Breton, Gif sur Yvette (FR); Eric Delagnes, Chaville (FR)

(73) Assignees: Centre National de la Recherche Scientifique, Paris (FR); Commissariat a l'Energie Atomique, Paris (FR)

( * ) Notice: Subject to any disclaimer, the term of this patent is extended or adjusted under 35 U.S.C. 154(b) by 400 days.

(21) Appl. No.: 11/630,753

(22) PCT Filed: Jun. 23, 2005

(86) PCT No.: PCT/EP2005/052932

§ 371 (c)(1),
(2), (4) Date: Dec. 22, 2006

(87) PCT Pub. No.: WO2006/003106

PCT Pub. Date: Jan. 12, 2006

(65) Prior Publication Data

US 2008/0298109 A1    Dec. 4, 2008

(51) Int. Cl.
*G11C 27/00* (2006.01)
(52) U.S. Cl. .................... 365/45; 365/189.12; 365/194; 365/233.1
(58) Field of Classification Search .................... 365/45, 365/189.12, 194, 233.1
See application file for complete search history.

(56) References Cited

U.S. PATENT DOCUMENTS

| 4,429,305 | A | 1/1984 | Hosokawa et al. ........... 340/784 |
| 5,144,525 | A * | 9/1992 | Saxe et al. .................... 365/45 |
| 6,611,475 | B2 * | 8/2003 | Lin ........................ 365/189.05 |
| 6,859,375 | B2 | 2/2005 | Breton et al. .................. 365/45 |
| 6,987,701 | B2 * | 1/2006 | Lin et al. ..................... 365/194 |
| 7,158,443 | B2 * | 1/2007 | Lin ........................ 365/189.07 |
| 2002/0005830 | A1 | 1/2002 | Watanabe ..................... 345/88 |

FOREIGN PATENT DOCUMENTS

| EP | 0435661 | 7/1991 |
| FR | 2824177 | 10/2002 |

OTHER PUBLICATIONS

International Search Report PCT/EP2005/052932 (Aug. 9, 2005).

* cited by examiner

*Primary Examiner*—Pho M. Luu
(74) *Attorney, Agent, or Firm*—Nixon Peabody LLP

(57) ABSTRACT

An analog sampler for continuous recording and read-out of analog data carried by a bus comprises an array of recording cells aranged in L rows and C columns. Each cell has an analog input coupled to the write bus and an analog output coupled to a read bus. The cells of a column are recorded sequentially, whereas the cells of another column already recorded are read-out simultaneously. A constant number of columns separates the write column from the read column. The system is looped so that writing and read-out go on indefinitely in a continuous way.

24 Claims, 8 Drawing Sheets

FAST ANALOG SAMPLER FOR CONTINUOUS RECORDING AND READ-OUT AND DIGITAL CONVERSION SYSTEM

CROSS REFERENCE TO RELATED APPLICATIONS OR PRIORITY CLAIM

This application is a national phase of International Application No. PCT/EP2005/052932 entitled "Fast Analog Sampler For Continuous Recording And Read-Out And Digital Conversion System", which was filed on Jun 23, 2005, which was not published in English, and which claims priority of the French Patent Application No. 04 51340 filed Jun 25, 2004.

DESCRIPTION

Technical Field

The invention relates to the field of fast analog samplers. It also concerns a system and a process for digital acquisition of an analog signal using the analog sampler.

STATE OF THE ART

U.S. Pat. No. 6,859,375 granted on Feb. 22, 2005 discloses a fast analog sampler with great memory depth.

It is an FISO (fast-in-slow-out) device of great depth with variable sampling rate that is capable of reaching or exceeding GHz. In such a device, write-in is fast so as to reliably sample wide-band signals, and read-out is done on an enlarged time-scale. The read-out time is thus significantly superior to the write-in time.

BRIEF DESCRIPTION OF THE INVENTION

In known devices, the signal is first sampled at high frequency in a matrix array of memory cells. After stopping of sampling, the recording cells are read more slowly and converted by one or several analog to digital converters (ADC). This solution is very economical in terms of power consumption and permits obtaining dynamic ranges greater than 12 bits. This solution only permits acquiring the signal to record in a time window of which the duration is depending on the number of cells in the recording matrix array and on the frequency of the clock driving a shift register 6. This register delivers a write column pointer signal which determines the write column. There are moreover dead recording times at least during the read-out of the recorded cells.

The present invention is an improvement to this known device and to its embodiment variants. It concerns an improvement, permitting the read-out of cells which have just been recorded, simultaneously to the recording of new cells. After read-out the cells are utilized again for the recording. The recording and the read-out can thus be pursued simultaneously in a continuous way during a period which is independent of the recording frequency and of the number of cells. By the expression "continuous recording" we mean that the instants of sample capturing follow each other at equal time intervals during a period as long as one wants or even permanently.

The read-out takes place a predetermined delay after the recording. A utilization of the invention with analog to digital converters (ADC), for example in a number equal to the number of rows of the matrix array, moreover permits a digital conversion of the recorded analog signal at a rate equal to that of the recording, each conversion of an analog sample into a digital sample being realized in a duration quasi-equal to the clock period of the shift register. One benefits thus from a sufficient conversion duration for obtaining a signal over noise ratio greater than 60 dB for a recording frequency of the order of the GHz. In addition, the sampling circuit according to the invention potentially completed by ADC's can advantageously be realized in CMOS technology, which is low-cost and easily available.

More precisely, U.S. Pat. No. 6,859,375 discloses a sampler for recording analog data relative to a signal comprising:

at least one analog bus carrying the signal to be recorded;

a matrix array of capturing and recording cells arranged in L rows or pairs of lines and C columns, each of the cells having at least one analog input coupled to the at least one analog bus and at least one digital input, each of the columns having one column input coupled to a digital input of each cell of said column, a write-in shift register having an entry for receiving a clock signal and a plurality of shifted outputs coupled to the matrix array column inputs.

The known sampler comprises, for each column, an associated delay line having an input of the delay line and successive shifted outputs in a number equal to or greater than the number of rows of the matrix array, the input of the delay line constituting the column input, the column input being coupled to one of the digital inputs of the cells of the column by means of said delay line, each delay line being formed by a succession of elementary delays, a first delay coupled to a digital input of a cell of the first row, each of the following elementary delays coupled bi-univocally to a digital input of a cell of one of the following rows, and a last elementary delay coupled to a digital input of a cell of a last row.

Thus there is a bi-univocal correspondence between the outputs of the delay line and the digital inputs of the capturing and recording cells.

According to the invention, said sampler of the prior art is improved because it comprises means permitting applying simultaneously to the writing of a column a read order to all the read digital inputs of the cells of a read column, said read column being a column which during the reading period does not comprise any cell in the course of being written.

One can notice that the cells which are being written when the write column signal arrives on a write column input are known as well as the column they belong to. This is the same case for the cells which will be written during the reading period, the duration of the latter period being known. So, if the signal controlling the start of reading of the cells of a column is synchronized in a predetermined way with the arrival of the write column pointer signal at the input of a write column, it becomes possible to affect the read start command signal to the cells of a column of which one knows they will not be written during the reading period. The read column will thus be a column different from that on which the write column pointer signal arrives, and more generally also different from the two columns adjacent to it in the writing order. It will thus involve cells of a column shifted by a number k of columns referring to the column receiving the column write pointer. So, according to one embodiment, the read column is shifted modulo C by k columns referring to said column receiving the column write pointer. According to one embodiment, the integer k is equal to 2. One notes that the synchronization which it is about between the arrival of the column write pointer at the input of a write column and the signal of start of reading does not necessarily mean simultaneity. There can be between these signals a predetermined algebraic time shift.

Means of synchronization for moving a signal in a synchronized fashion towards successive inputs are known of the man skilled in the art.

The selection of a write column determines the choice of a first write cell, for example the cell found in said selected column and in the first row. The write cell in a write column is determined by the output of a cell write pointer signal originating in the delay line associated with this column. The writing in the first cell of said column is made possible because a write bus carrying the signal to record is connected to this cell via a switch controlled for its opening and closing. The control of this first switch is deriving from the cell write pointer signal. This write pointer signal is propagated along a delay line next to a write switch of the following write row and so on until attaining the last of the matrix array recording rows. Thus each one of the storage matrix array columns is equipped with a delay line comprising at least as many outputs as matrix array rows. The cell write pointer signal at each output of a delay line commands the selection of a single cell and provokes a commutation of beginning or end of sample capturing only for this single cell. By the same realization principle we are assured that the sampling of a current cell only takes place after the sampling of a preceding cell, since the cell which can be sampled at a given time is unique.

The cell write pointer signal at the delay line input can be either the write column pointer, or the latter reshaped. The beginning and the end of sample capturing are determined respectively by a rising edge and a falling edge of said write pointer signal coming from said delay line. This way, for each sample capturing, only the cell of the write column determined by the arrival of a cell write pointer signal edge coming from the delay line is switched. This means that a sample capturing is only begun by a next cell after the beginning of sample capturing of a preceding cell. This is the same for the end of sample capturing, which only takes place after the end of sample capturing of a preceding cell.

At any time, a single rising edge and a single falling edge of sample capturing order are propagating in the entirety of matrix array delay lines.

This first characteristic permits minimizing the write-in noise. In particular, one avoids a high repetition frequency commutation noise and thus a large spectrum noise being diffused in all the matrix array and perturbing the signal to record. Moreover, constant and approximately equal sample-capturing durations of each one of the cells are thus ensured. This sample capturing duration is equal for all the cells to the duration separating a rising edge and a falling edge of the cell write pointer signal. This is also why, after a beginning period, the number of cells in sample capturing phase remains constant. Thus the bandwidth of the system is constant and the distortion of the sampled signal is greatly diminished.

The sampler improved for read-out according to the invention is compatible with all the embodiments described in the patent filing U.S. Pat. No. 6,859,375 and notably:

According to an important optional characteristic of a first embodiment, the sampler comprises at least for one delay line associated with a column or for a supplementary delay line a phase comparator receiving by a first input a signal from said delay line and by a second input a reference signal, one output at least of the phase comparator being coupled to a charge pump, of which one output is coupled to means for controlling a regulating voltage of the elementary delays. One thus obtains a constant duration of the individual delays of a delay line despite the temperature variations or a long term potential skews of the delays for the nominal controlling voltage. This characteristic ensures that the end of sample capturing of the last cell of a column and that of the first cell of the following column are consecutive in the same manner as those of the cells of the same column. This means that the delay separating the end of the sample capturing of two consecutive cells of the same column is equal to the delay between the end of sample capturing of the last cell of a column and the end of sample capturing of the first cell of the consecutive column. This is also true for the instants of beginning of sample capturing because the duration of the sample capturing is determined by the duration of the cell write pointer signal which is a signal of quasi-constant duration.

According to one embodiment, the matrix array of recording cells is folded upon itself, the write shift register comprising a 180-degree bend thus forming an outbound part situated before the bend and a return part situated after the bend, the columns and their associated delay lines coupled to outputs of the write shift register situated on the return part being intercalated between the columns and their associated delay lines coupled to outputs of the write shift register situated on the outbound part.

According to one embodiment, an analog bus carrying the signal to sample is divided for supplying divisions, each division corresponding to a row of the matrix array, and each of the divisions housing a follower amplifier receiving the signal to sample and buffering it for its capture.

According to one embodiment, each cell of the matrix array included in a sampler comprises at least two write switches. A first terminal of the cell is coupled through a first controllable switch to one of the divisions of the bus. This first write switch is connected to a hot part of the write bus. The second terminal of the cell is connected to a return part of the bus, this return part being at a constant voltage, for instance the voltage of the ground, through a second controllable switch. At the time of connection to the write bus, the order of the activation of the switches doesn't really matter. Conversely, at the time of the disconnection of the cell from the write bus, this is the switch connecting the cell to the cold or return part of the bus which is activated first. In order to fulfill this condition, it is sufficient that a command input of this switch receives a disconnection signal a short while before the second switch which connects said cell to the hot part of the bus receives its own disconnection signal. The cold part of the write bus being at a constant voltage, there is no influence of the stored value on the sampling time. So according to one embodiment the second switch of each cell has a command input connected upstream of a delay means commanding the opening of the first switch in such a way that the second switch is always open before the first switch.

Finally according to another optional characteristic, the sampler is a differential sampler. It comprises a first bus carrying the positive polarity Vin+ of the input signal configured to be connected to a first source delivering the signal to be sampled at a first polarity, and a second bus carrying the negative polarity Vin− of the input signal configured to be connected to a second source delivering the signal to be sampled at a second polarity that is the inverse of the first polarity, both buses being divided to supply the divisions. The matrix array is organized in consecutive pairs of lines. The first line of a pair is connected to a division of the first bus; the second line of a pair is connected to a division of the second bus. The lines of a pair being consecutive, the sampling times of cells of a pair of lines belonging to the same column can be quasi-simultaneous.

Each of the divisions of a divided bus preferably houses a follower amplifier.

BRIEF DESCRIPTION OF THE FIGURES

Other features and advantages of the invention will become apparent when reading the exemplary description of embodiments and alternatives which will be made below in accordance with the appended drawings in which.

DETAILED DESCRIPTION OF EXAMPLES OF EMBODIMENTS OF THE INVENTION

Figure 1:
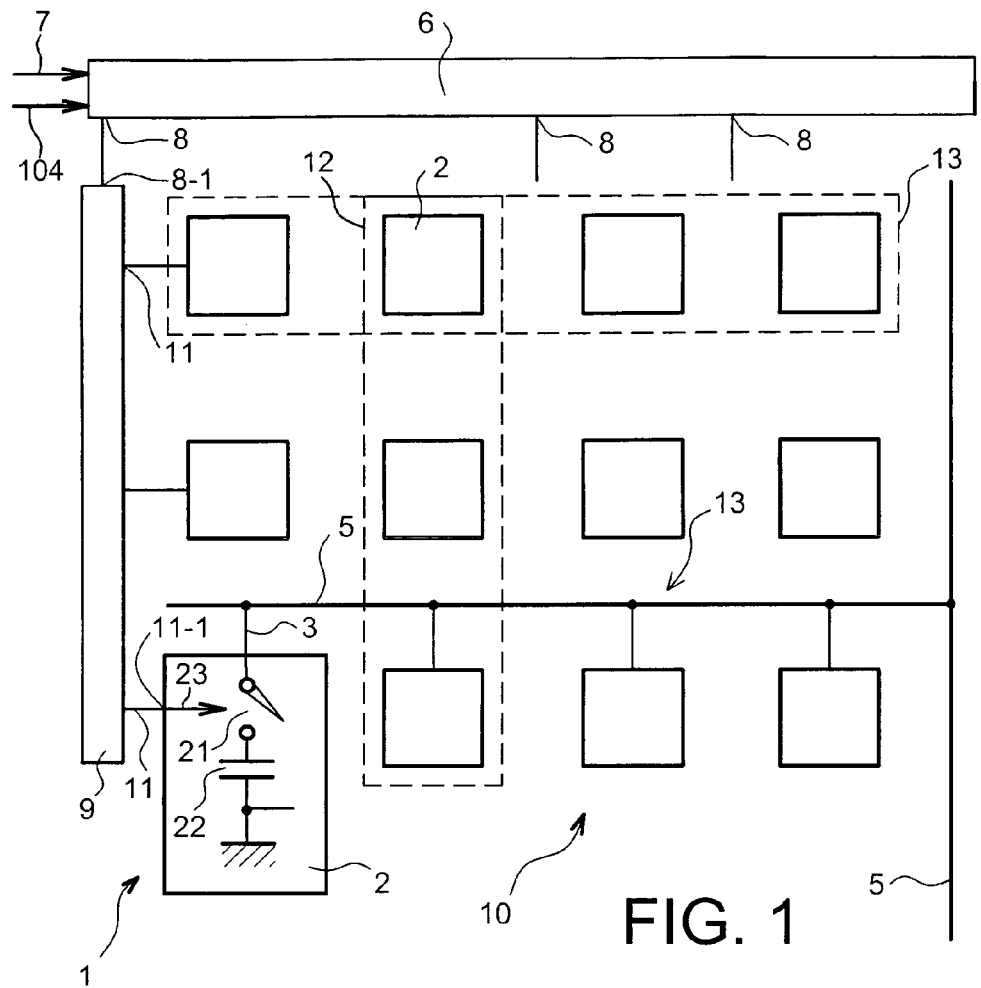
FIG. 1 is a diagrammatic representation of the most general embodiment of the known device.

The description of the known device described in U.S. Pat. No. 6,859,375 already cited above will be revisited in a more detailed fashion below, for the current invention is an improvement of the known device permitting the recording of an analog signal and its continuous read-out. The known device represented on FIG. 1 comprises a matrix array 10 of cells 2 composed of a preferably even number of L rows each referenced 13 and of C columns each referenced 12. The number L of rows can be anyone, however in practice the array of such a sampler is advantageous only if the number of rows is greater than 4 as represented on FIG. 3. The number of cells 2 is thus equal to L×C. Each of those cells 2 has an analog input 3 connected to an analog bus 5. In order to simplify the figure, in FIG. 1 only the connection to the bus 5 of the cells of the last row 13 is represented. A so-called column write shift register 6 has an input 7 coupled to a source (not shown) of a clock signal supplying a signal at a so-called main frequency Fp. This shift register 6 has successive outputs 8. Each output 8 of the write register 6 is coupled to an input 8-1 of a delay line 9. The delay line 9 has a number of successive outputs 11 at least equal to the number of rows of the matrix array 10 of cells 2. In FIG. 1, in order to simplify the figure, one single delay line 9 is shown but it must be understood that similar delay lines 9 are associated with each column of the matrix array of cells 2, such that in total there are at least C delay lines 9. It will be seen in the following that in one of the embodiments there can be an additional delay line dedicated to the control of the transit time of the whole set of delay lines. All of the cells 2 are similar. Because of the simplifications applied to the representation, only the cell 2 situated in the lower left corner of the matrix array of cells 2 is represented with a digital command input 11-1 connected to the output 11 of the delay line 9 and with its analog input 3 connected to the bus 5. It must, however, be understood that the same applies to all of the cells 2. In order to illustrate details of each cell 2, the cell 2 situated in the lower left corner of the matrix array of cells 2 is represented on an enlarged scale relative to the other cells.

Each cell 2 comprises first switching means represented in the form of a first controllable switch 21 and a storage capacitor 22, having one terminal connected to the switch 21. The other terminal of the switch 21 is connected to the analog bus 5. The control input 23 of the switch 21, symbolized by an arrow, is connected to the digital input 11-1 of the cell 2. Operation is as follows:

A column write pointer signal of a duration for example equal to 1/Fp introduced via input 104 of the register 6 is propagated from one output to the next of said register 6 at a frequency Fp introduced via the clock input 7 into said shift register 6 of C outputs 8. The write column pointer signal at the output of each of said outputs 8 of this register 6 is coupled to the delay line 9 comprising L identical delays, each of a duration of 1/(L×Fp). The cell write pointer signal coming out of each of the successive delays of the delay line 9 constitutes the control input 23 of the write switch 21 in one of the capacitors 22 of the matrix array. Accordingly the cell write pointer signal issued from a delay i of column j will permit the recording of the value of the sample of the analog signal in the memory cell $2i,j$, situated at the intersection of the row i and column j. i and j are integer numbers between 1 and L and 1 and C, respectively.

The device 1 thus makes it possible to carry out the sampling of an analog signal with a virtual period of 1/(L×Fp), which corresponds to a maximum sampling frequency rate Fech=L.times.Fp. If each of the individual delays between consecutive outputs 11 of the delay line 9 is, for example, of the order of one nanosecond, which corresponds to a frequency between sample of one GHz, with 20 rows one can use a 50 MHz Fp clock signals.

The device that was described above according to FIG. 1 presents the following advantages:
  all the cells have a sample capturing duration quasi-identical,
  There is no signal at a frequency greater than Fp in the circuitry even when the sampling frequency is greater than Fp.
  those characteristics permit:
  limiting the perturbations of the analog signals by the digital control signals,
  diminishing the dissipated power.
  A few particularities of matrix array 10 will now be described according to FIGS. 2,3 and 4 which represent each a matrix array 10.

Figure 2:
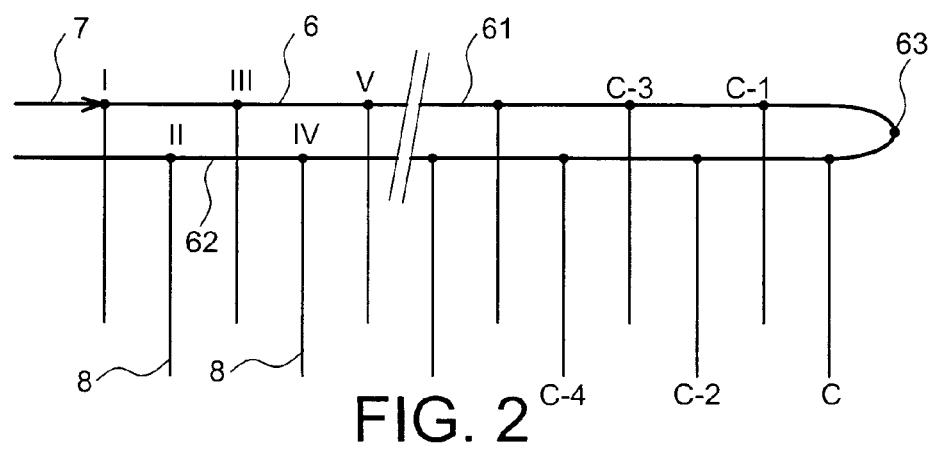
FIG. 2 is a diagrammatic representation of physical arrangement of the columns of a matrix array of the known device in which the array is folded.

According to one embodiment, diagrammatically represented in FIG. 2, intended to prevent discontinuities due to edge effects, in particular those linked to propagation times, the matrix array 10 of recording cells 2 is folded onto itself. The shift register 6 comprises a 180.degree. bend 63 thus forming an outbound part 61 situated before the bend and a return part 62 situated after the bend. Columns 12 and their associated delay lines 9 coupled to outputs 8 of the write shift register 6 situated on the return part 62 are intercalated between columns 12 and their associated delay lines 9 coupled to outputs 8 of the write shift register 6 situated on the outbound part 61.

The column write pointer initially in the first part 61 of the column write register 6 goes left to right up to the 180.degree. bend 63. The outputs 8 of this first part 61 are coupled to a first part of the columns 12, for example to the columns 12 physically of odd ranking. At the entry, in this example, in column having rank C-1 of the register, corresponding physically to the penultimate column of the matrix array, the pointer will pass to the next column 12 physically of even ranking. The write column pointer will then retrace its steps by returning to the left over all of the columns physically of even ranking. In FIG. 2 the shift register 6 has been symbolized by a horizontal line running from the left to the right then from the right to the left. Each of the columns 12 comprised of a delay line 9 and L cells 2 has been symbolized by a vertical line having an even or an odd ranking. The first columns physically of odd ranking (1, 3, 5, . . . C-1) and the column physically of even ranking C are on the path 61 of the shift register 6 running from left to right. The last columns 12 physically of even ranking (C-2, C-4, . . . 4, 2) are on the path 62 of the shift register 6 running from right to left. In FIG. 2 the column rankings are indicated in Roman numerals in order to distinguish them from the other reference symbols indicated in Arabic numerals. Each column 12 physically of odd ranking with the possible exception of a first or a last one is thus situated between two columns of even ranking. The direction of path of the columns 12 for the recording process goes with this physical disposition of the columns in the direction of the increasing odd rankings then in the direction of the decreasing even rankings.

Several particularities of the matrix array 10 will now be described with reference to FIGS. 3 and 4 that each represent a potentially folded matrix array 10, as has just been described above but in the representation of FIGS. 3 and 4, the array 10 is represented unfolded in order to simplify the figures.

Figure 3:
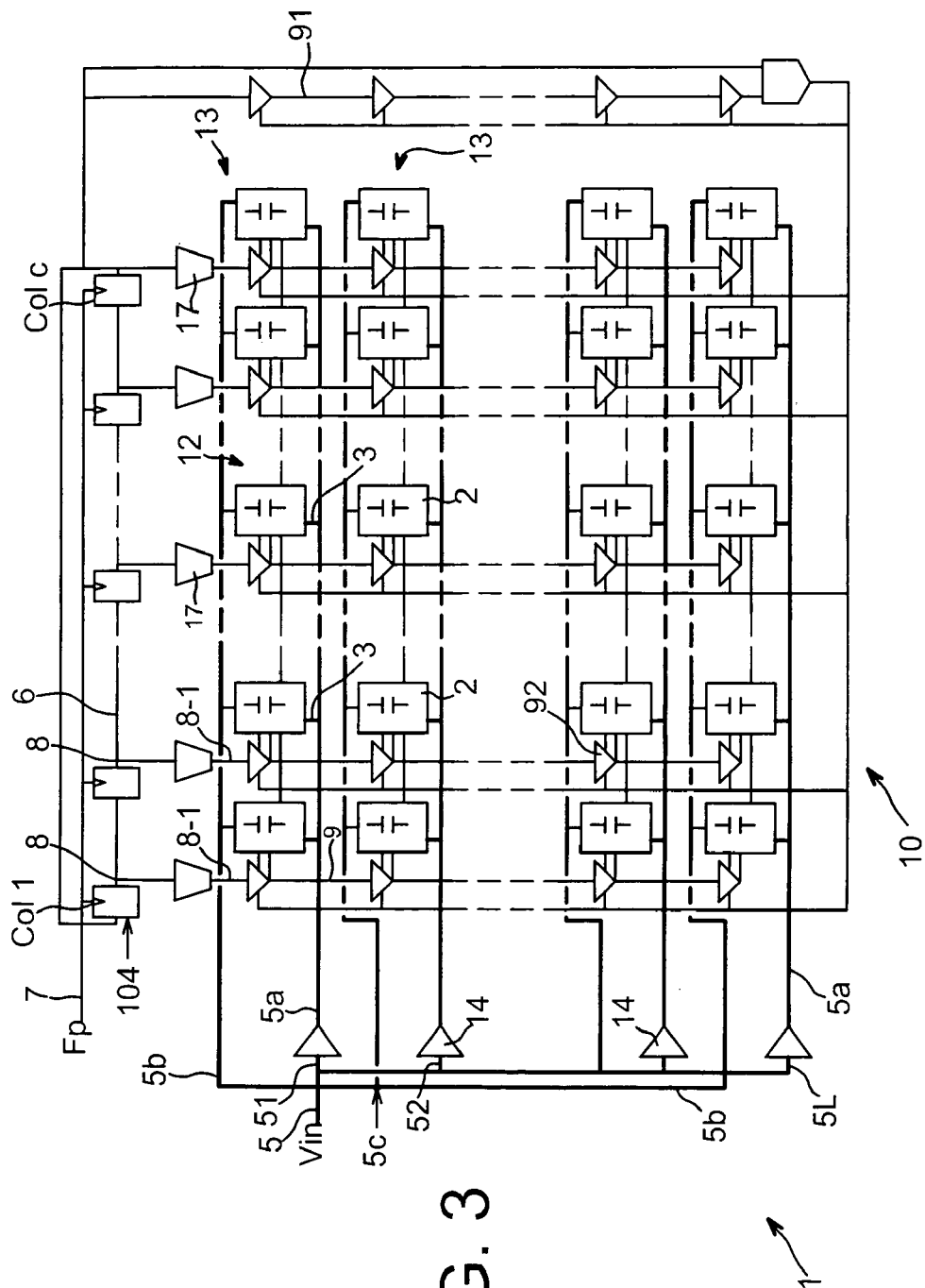
FIG. 3 is a first example of an embodiment of the known device.
Figure 4:
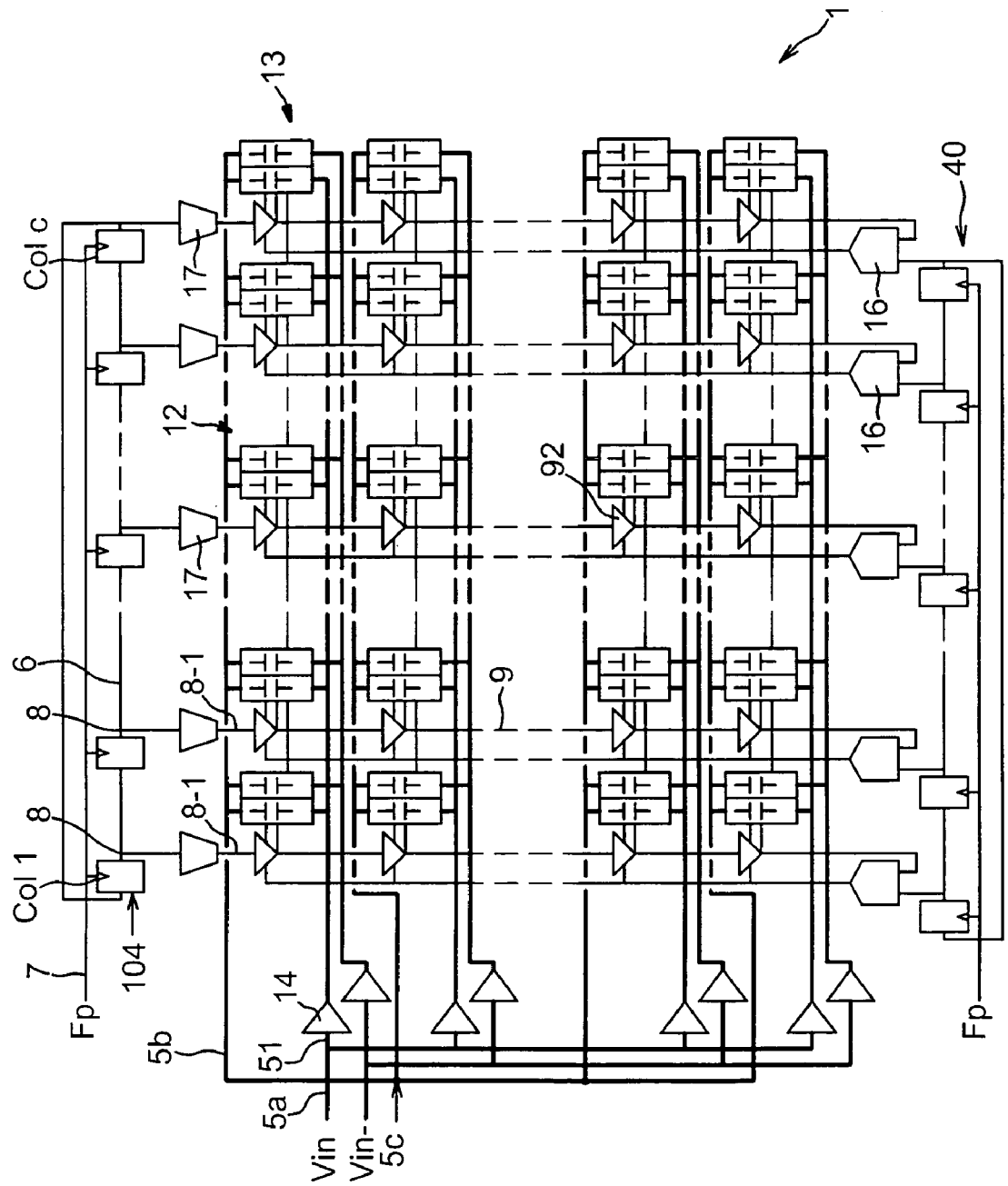
FIG. 4 is a second example of an embodiment of the known device showing in particular an embodiment in which the number of rows is even with two consecutive lines; the one recording the polarity of the signal to be recorded and the other recording the inverse polarity.

In the embodiments represented in FIGS. 3 and 4, the analog input bus 5 is divided into as many divisions 51, 52 . . . 5L as rows 13 of the matrix array 10. The bus 5 and its divisions comprise a write bus 5a and a return write bus 5b set at a reference voltage. The return buses 5b of the write signal are connected directly together to a reference input 5c of the input signal. In these examples, each of the divisions 51, 52 . . . 5L of the analog bus houses a follower amplifier 14 (called write amplifier), of which the input receives the analog signal to be sampled and of which the output is situated upstream of each of the divisions in such a fashion that the cells 2 receive the signal present on the output of a follower amplifier 14. Accordingly, the analog signal is buffered from the time of its entry into the circuit by L, or 2 L in the case of FIG. 4, wideband follower amplifiers that each drive one division of the upper write bus 5a connected to C memory cells 2. These amplifiers 14 present an excellent pairing in terms of bandwidth and signal rise time. This embodiment presents the following advantages:

permitting any discharge and recharge of the capacitor 22 of each cell via the amplifier 14 over a connection time of the cell to the bus 5 via the switch 21, this connection time being able, for example, to be as great as 1/Fp, or even greater;

each of the L divisions of the analog bus 5 is sampled at the maximum at the rate of Fp;

the constraints on the amplifiers buffering the analog input at the level of each division can be relaxed;

the duration of the perturbations due to samplings on the write buses can be almost as long as the period of a reference clock delivering the signal at the frequency Fp;

this makes it possible to obtain a high signal-to-noise ratio, low distortion of the recorded signal and a high dynamic range.

So that the path time of the write pointer signal along a delay line 9 associated with a column 12 is always equal to the transit time of the column write signal from an output 8 of the write shift register 6 to the immediately following output, the delay lines 9 are servo-controlled for what concerns their propagation time. The delay controlling means can be present for each of the C columns of the array 10, as represented in FIG. 4. For this purpose, each of the rows 9 comprises an assembly 16 of a phase comparator and a charge pump making it possible to regulate a polarization voltage of elementary delays together constituting one delay line 9.

The propagation time controlling means can also be present for only one of the C columns of the array serving as reference column. In this case, wherein the control is practiced on one single column serving as the reference column, it is preferable, as shown in FIG. 3, to dispose of a supplementary delay line 91.

This embodiment using a single delay line that serves in controlling each of the other delay lines is more adapted to matrix arrays in which the number of cells is small, in particular the number of cells per column.

A more detailed structure and the functioning of the regulating means of the travel time along the delay lines 9 will be explained below.

In the preferred embodiment shown in FIG. 4 the signal to be recorded is processed in a fashion known per se upstream of the device according to the invention so as, to obtain a bipolar signal comprising two polarities Vin+ and Vin−. Each of the polarities Vin+ and Vin− of the signal is recorded separately so that a recording of L×C samples of each polarity requires a number of lines equal to 2 L.

Optionally, as represented in FIG. 4, the write shift register can be duplicated into a write register 6, and a reference register 40. The two registers 6, 40 are identical and receive the same clock signal. The reference register 40 is utilized at the time of writing for controlling the propagation time over the delay lines 9.

The structure and function of the elements that together constitute the matrix array 10 will now be explained.

The structure and the function of a memory cell 2 will first be explained with reference to FIGS. 5 to 7.

Figure 5:
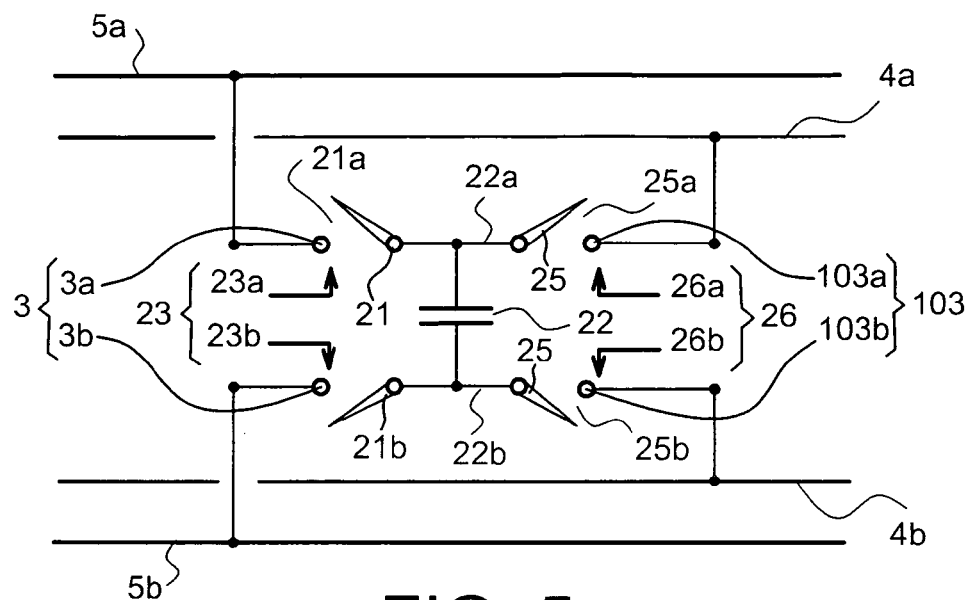
FIG. 5 is a diagrammatic representation of an exemplary embodiment of a recording cell of the known device.

With reference to FIG. 5, each cell 2 comprises the storage capacitor 22 of a voltage representative of the analog input magnitude. The capacitor 22 has two terminals 22a and 22b. The first write switching means 21 are comprised of two parts which are the two switches 21a and 21b. The terminal 22a is coupled by means of the first part 21a of the first write switching means 21 to the upper part 5a of the analog bus 5. The part of the first part 21a of the first switching means 21 permanently connected to the bus 5a forms a first analog input 3a of the cell 2. The terminal 22a is also coupled by means of a read switch 25a to the hot part 4a of an analog read bus 4. The terminal 22b is coupled by means of the second part 21b of the write switching means 21 to the cold part 5b of the analog bus 5. The part of the switch 21b permanently connected to the bus 5b constitutes a second analog input 3b of the cell 2. The terminal 22b is also coupled by means of a second read switch 25b to the cold part 4b of the analog read bus 4. The switches 21a, 21b, and 25a, 25b together constitute, respectively, the write switching means 21 and read switching means 25. Each of the switching means 21, 25 is controlled for opening and closing by the control means 23, 26, respectively. The control means 23, 26 are comprised of a control means 23a, 23b and 26a, 26b, respectively, also symbolized at this stage by arrows 23a, 23b and 26a, 26b controlling, respectively, the switches 21a, 21b and 25a, 25b.

An exemplary embodiment of the write switching means, of their controls at the level of each cell 2 will now be explained in conjunction with FIG. 6.

The write switching means comprise:

the upper write switch 21a based on CMOS transistor, thus comprising a PMOS transistor and an NMOS transistor connected in parallel by their drain-source path;

the lower write switch 21b based on NMOS transistor.

The CMOS switch 21a is composed of a NMOS transistor, SEHBN, controlled by a write signal wi obtained by inversion of a wi* signal via a first polarity inverter 28 applied to the gate of said SEHBN transistor and a PMOS SEHBP transistor controlled by a wp* signal obtained by inverting the polarity of a wp signal by means of a second polarity inverter 28, applied to the gate of said SEHBP transistor. The SEHBN and SEHBP transistors are placed in parallel.

Each switch 21b is composed of an NMOS transistor. The second switch 21b of the first switching means 21 is controlled by a write signal wi applied to its gate. The switch 21b is placed in series between the lower bus 5b and the second terminal 22b of the capacitor 22.

The signals Wi* and Wp are write signals coming from the delay line 9. All of the signals that have just been mentioned are logical signals applied to digital inputs 11-1a and 11-1b of a cell 2.

Figure 6:
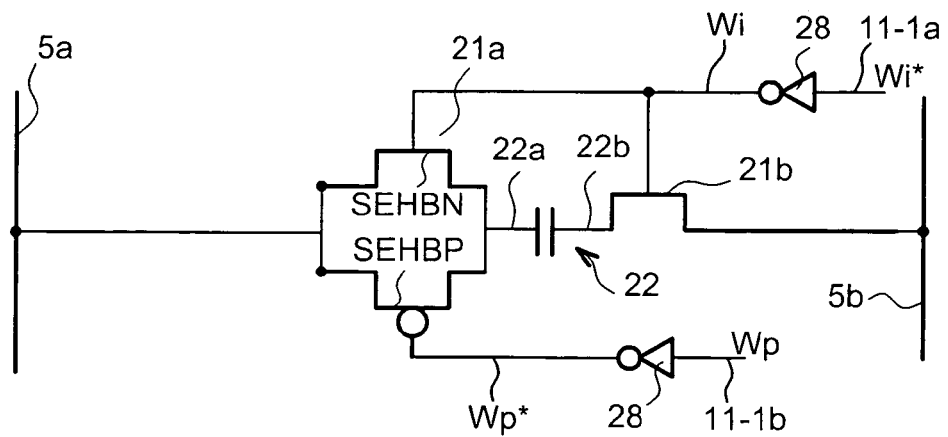
FIG. 6 is a diagrammatic representation of an exemplary embodiment of the switching means present in the cell of the known device for validating said cell and switching said cell on the data bus to be recorded or on the read bus.

In the example represented in FIG. 6, the write digital inputs of a cell 2 are used to generate the control signals applied to the gates of the two transistors together constituting the switch 21a, and to the gate of the transistor 21b.

The operation at this stage for writing only will now be discussed in conjunction with FIG. 7.

Figure 7:
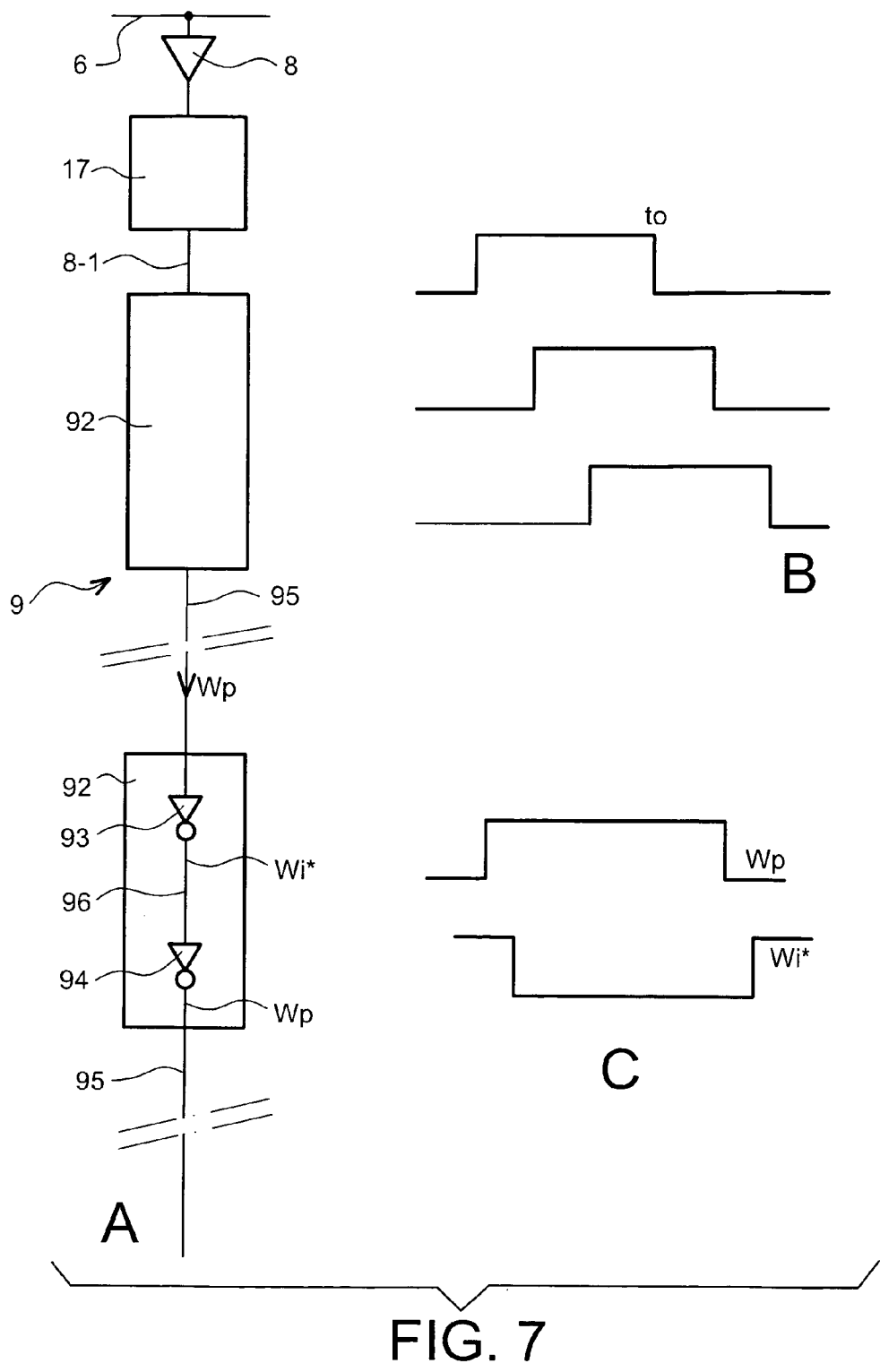
FIG. 7 comprises parts A, B and C. Part A is a diagrammatic representation of a delay line of the known device. Parts B and C represent signal shapes of the known device.

The elements necessary for an understanding of the chronology of writing are shown in FIG. 7, part A.

In the present example, the system for generating a write control is comprised of:

the write shift register 6 comprising C outputs 8 corresponding to each of the columns 12;

C shaping blocks referenced 17 in FIGS. 3 and 4;

C delay lines 9 each comprising a number of outputs at least equal to the number of rows; that is, at least L outputs (FIG. 3) and 2 L outputs (FIG. 4).

Only one of these lines 9 is represented in FIG. 7, part A. The row is comprised of L or 2L elementary delays 92. In an advantageous embodiment each of the elementary delays 92 is comprised of two elementary half-delays 93, 94 arranged in series. Such an embodiment is represented for only one of the delays 92 in FIG. 7, part A.

In the example represented in FIG. 7, part A, wherein each delay 92 is composed of two half-delays 93, 94, the number of outputs of the delay line is a multiple, for example in the case represented, equal to two of the number of elementary delays 92. In the particular exemplary embodiment, each of the half-delays is comprised of an inverter. Accordingly, a signal wp present at the input of a half-delay 92 will be transformed into a signal wi* after path into the half-delay 93 and after path into the half-delay 94 it will be again a signal wp. The wi and wp signals are logical signals. The column write shift register 6 is driven by the main clock at the main clock frequency Fp. Upon initialization of the circuit 1, its first cell is set to 1 (PRESET), all others are set to 0 (RESET). A unique pulse, called the write column pointer, lasting in this case 1/Fp, is thus propagated along the register at the rate of one output per period 1/Fp.

After (C-1) clock periods, the pulse arrives at the last cell of the register 6. At the following clock edge a new pulse will be generated in the first output of the register. For this, two solutions can be foreseen:

either by looping the output of the register over the input;

or by making a new reinitialization of the register when a counter, triggered at the time of the previous initialization will have counted C clock periods.

The means and their connections for realizing these functions are known per se and have not been represented, Each of the pulses issued from the C cells of the register are then re-shaped and notably set to the desired duration for the capture duration t0, during which the capacitor 22 is connected simultaneously to the upper bus 5a and to the lower bus 5b. This re-shaping is done in each shaping block 17 for example, by performing a logical AND or an OR of the signal leaving the register 6 with this same signal, of which the rising or falling edge is delayed to obtained the desired duration. The signal re-shaped from the column pointer signal by the shaping block 17 constitutes the source of the cell write pointer signal.

At the output of each of the shaping blocks 17 the cell write pointer signal is sent into the delay line 9 composed of L elementary delays 92 in the examples represented in FIGS. 3 and 4, respectively.

These are the cell write pointer signals from each of the elementary delays 92 together constituting the delay line 9 that constitute both the closing and opening control signals of the switches 21 and 22.

The signals issued from shaping blocks 17 have the form represented in FIG. 7, part B. These are square wave signals having a duration of t0. The signal is comprised of a leading edge, followed by a constant part constituting a high logical state, and then a back edge leading to a low logical state. At each output 95 of an elementary delay 92 of the delay line 9, the signal has the same shape and the same duration but the leading and back edges of the consecutive outputs 95 are shifted relative to each other by the duration of one elementary delay 92 such that between the first and the last row the edges of these signals are increasingly shifted relative to the edges of the signal traversing the shift register 6. Three of these signals present at consecutive outputs 95 are represented in FIG. 7, part B. In the simplest embodiment one can conceive that each of the switches 21a and 21b is constituted by a transistor, of which conducting state is controlled by the high logical state of the signal present at each output 95.

One such embodiment has the advantage of simplicity but it has drawbacks that will become apparent when reading the description that follows of a preferred embodiment.

The signal present at an intermediate output 95 situated between the two delays 92 has the form and the duration of the signals represented in part B FIG. 7, but the signals present at the intermediate outputs 96 between two intermediate half-delays 93, 94 together forming an elementary delay 92, have a reversed polarity. These signals are shifted relative to the back edge of the signal from the shift register 6 by an odd number of half-delays and no longer by an integer number of delays. A set of two signals wi* and wp is represented on FIG. 7 part C.

The write chronology of a sample using switches 21a and 21b as represented in FIG. 6, will now be explained.

The output 96 is connected via an inverter 28 to a digital input 11-1a of the cell 2 coupled to the gate input of the NMOS transistor constituting a part of the switch 21a and to the gate of the transistor 21b, respectively. When the signal wi passes to the high logic state, these two transistors are made conducting such that the capacitor 22 is connected between the buses 5a and 5b. The instant of closing of transistors 22a and 22b occurs after the leading edge of the signal issued from shift register 6 at an instant of which the delay relative to this leading edge is a function of the number of elementary delays 92 between the column write shift register 6 and the cell 2.

This number of delays corresponds to the number of the row at a half-delay close. These switches 21a and 21b are being closed simultaneously and remain closed simultaneously over the period of t0 corresponding to the duration of the signal wi. During this period t0 the voltage between the terminals of the capacitor 22 thus follows the voltage difference between the two write buses 5a and 5b. This is a capture phase, during which the voltage at the two terminals of the capacitor 22 evolves and follows the fluctuations of the signal to be recorded. It will be noted with reference to FIG. 6, that it is sufficient that one of the transistors constituting the switch 21a, for example the NMOS transistor, is conducting so that the switch 21a is closed. The second transistor—the PMOS transistor—constituting the switch 21a will be conductively controlled when the signal wp is going to go to the reverse high logic state. This means that this transistor is going to become conducting one elementary half-delay after the NMOS transistor constituting part of the switch 21a, will itself have been made conducting. Similarly, this transistor will become non-conducting a half-delay after the NMOS transistor comprising part of the switch 21a will have itself become non-conducting. This transistor will thus still be conducting at the instant of opening of the NMOS transistors constituting part of the switch 21a and the switch 21b, respectively. This means that the switch 21b is opened before the switch 21a. This is thus the switch 21b which controls the instant of sampling of the signal present on the bus 5, because the charge of the capacitor 22 stops once one of its terminals is disconnected. The voltage between the terminals of the storage capacitor 22 then memorizes the voltage difference between the two write buses.

The actual sampling being uniquely performed by the switch 21b connected to the bus 5b, of which the voltage is constant, the instant of sampling as well as the charge injected by the switches are independent of the amplitude of the analog signal recorded.

Another advantage of this embodiment comes from the fact that an NMOS transistor and a PMOS transistor are put in parallel in order to realize the switch 21a. Because of this assembly, the impedance of the switch 21a is independent to a large degree of the value of the signal to be recorded, which leads to less distortion of the recording.

Thus, according to the embodiment that has just been described, the second switch 21b of each cell 2 has its control input connected to the intermediate output 96 of an elementary delay 92 of the delay line 9 which is situated upstream of an output 95 of the same elementary delay 92, to which the control input of the first switch 21a is connected.

In the embodiment represented on FIG. 4 with a recording with opposite polarities, two solutions for sampling the signal are possible: according to a first solution, the even and odd ranked lines of a pair are connected from the point of view of the write controls to a same output of the delay line. According to another solution the even ranked lines of a pair are sampled a half-delay after the odd ranked lines of this pair. In order to do this, it is sufficient to connect the sampling control digital inputs of the even lines to an output of a half-delay 93 or 94 of the delay line 9 situated immediately downstream of the output of the half-delay connected to the sampling digital input of the odd ranked line.

In a manner known per se, polarity inverters for inverting the control signals of the sampling operation for controlling the PMOS and NMOS transistors according to the chronology indicated hereinbefore may be necessary.

Accordingly, upon reading the mode of operation described hereinbefore, it can be seen that the process used is a process for capturing analog samples of an analog signal present on an analog bus in cells 2 together forming a matrix array 10 of cells having C columns 12 and L rows 13 or pairs of lines, C and L designating integer numbers, wherein:

a signal of start of sample capturing for a cell is received on a first digital input of said cell;

and in which a signal of end of sample capturing is received on a second digital input of said cell.

One thus generates successively as described above for instance in the shaping block 17 of each column, a unique pulse having a rising and a falling edge, such that the signals for the start and for the end of the sampling operation are constituted of the rising and falling edges of said pulse, these edges being received successively over the two digital inputs 11-1a and 11-1b. Those two inputs are successively the first start control input and the second end control input of the sample capturing.

The duration of the sampling operation is thus determined by the duration of the sampling pulse comprising the rising and falling edges constituting the control signals for the start and end of the sampling operation. Due to the fact that this pulse is propagated from a current cell to a following cell without deformation via the successive elementary delays 92, the duration of the sampling operation is the same for all of the cells of the matrix array. It is equal to the duration t0 of the pulse.

It has been indicated hereinbefore that the duration of the sum of the individual L delays of a delay line 9 is controlled so that it remains equal to the duration separating two consecutive outputs of the write shift register 6.

The regulation of the contribution of each elementary delay or elementary half-delay to the overall delay can be made in a manner known per se by control of a voltage Vcom. This regulation will now be explained with reference to FIG. 8.

A servo controlled system makes it possible to fix the control voltage Vcom so that the delay of one cell is equal to $1/(L \times Fp)$. Each column has its own feedback.

Each of the last elementary delays of each delay line 9 is connected to a first input 18 of a phase comparator 30 belonging to said line 9. A second input 19 of the phase comparator 30 is connected to an output of a reference signal generator originating in the shift register 40. Outputs 31, 37 of the phase comparator 30 are connected to positive and negative inputs, respectively, of a charge pump 32 known per se comprising a positive current generator and a negative current generator. An output 33 of the charge pump 32 is connected to a terminal 35 of a capacitor 34, of which the other terminal 36 is connected to a reference voltage source.

Figure 8:
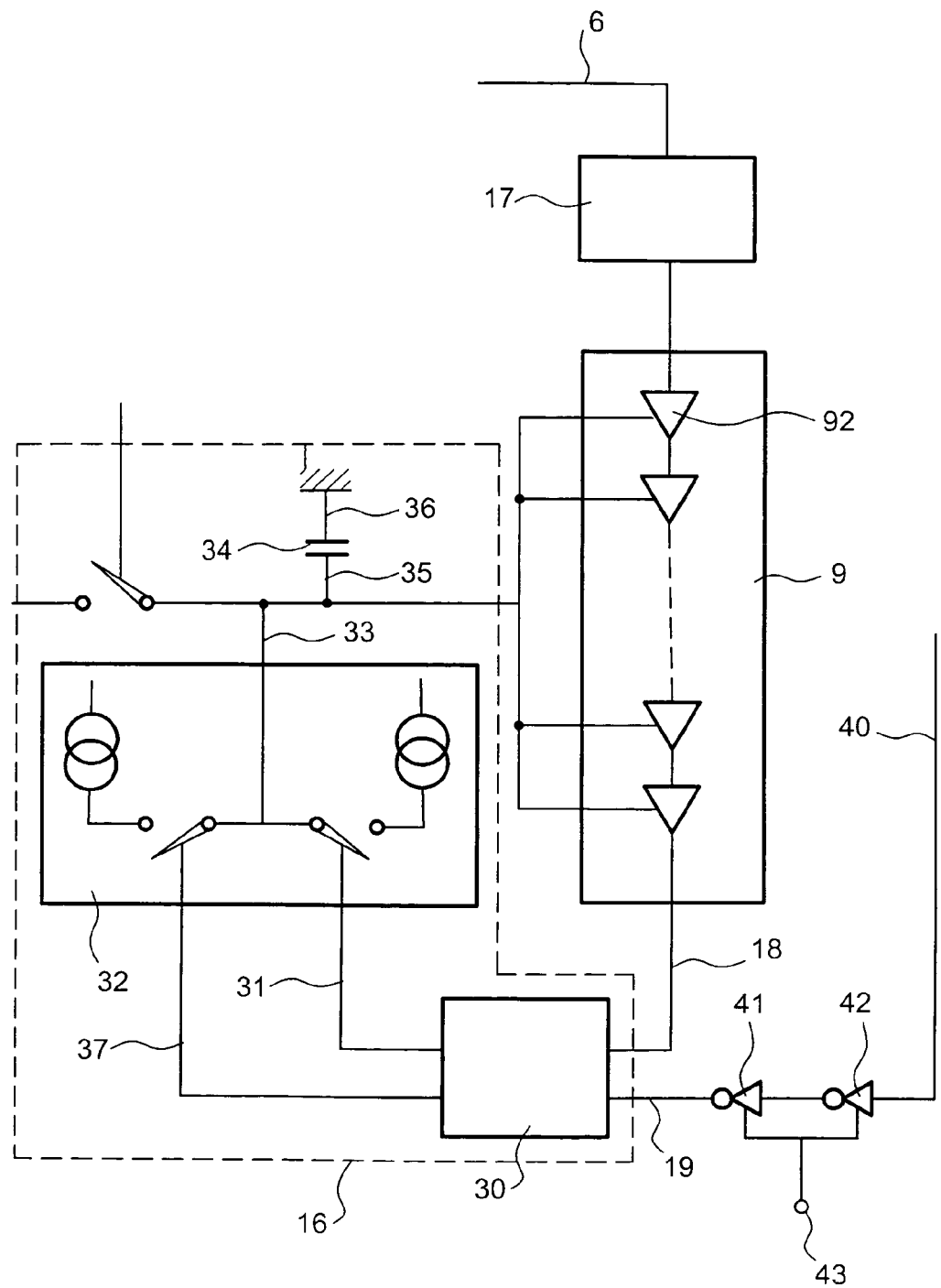
FIG. 8 is a diagrammatic representation of the circuitry controlling the delays of a delay line of the known device.

As represented in FIG. 8 the output of the shift register 40 supplying the column 12, of which the path time is controlled, is connected to the input 19 of the phase comparator 30 via the two inverters 41, 42.

The operation is as follows:

The phase of the back edge of the signal issued from the last elementary delay 92 of the delay line 9 of a column 12 is compared in the phase comparator 30 to the back edge of the reference signal issued from the register 40. If the signal issued from the last elementary delay 92 of the delay line 9 is in advance relative to the reference signal, the phase comparator 30 activates the charge pump 32 that injects a positive charge proportional to the shift in time into the capacitor 34. The voltage Vcom present on the terminal 35 will increase and consequently the propagation time in the inverters 93, 94 together constituting each of the elementary delays of a delay line 9 will be larger, which will tend to put back in phase the signal emitted by the delay line 9 and the reference signal.

Conversely, if the signal issued from the last elementary delay 92 of the delay line 9 is delayed relative to the reference signal, the charge pump must inject a negative charge into the capacitor 32 in order to accelerate the transit time in the inverters 92, 93.

Before the comparison, the two inverters 41, 42 with rising edges controlled by an exterior voltage (Vdac) originating in a source 43 delay the reference signal introduced on the input 19 of the phase comparator 30. The voltage issued from the source 43 is set so as to compensate for the delay induced by the formatting block 17. It moreover permits to adjust the delay of the nominal path time of the line 9, for example exactly 20 ns in the example discussed here where the elementary delays 92 of the 20 rows are 1 ns, and this with considerable precision.

Because of the fact that in the embodiment that has just been described the path time of each column 12 by the pulse, of which the rising or falling edges constitutes control signals of beginning and end of sample capturing of the analog signal, is controlled in order to be equal to the duration of the period of the clock signal controlling the shift from one recording column to the next, it is sure that there is no simultaneous recording of samples or lack of samples at the time of the shift from one recording column to the next, and this even if the duration of the delays at their nominal functional voltage gets to vary for that nominal voltage, for instance in consequence of a slow drift with time or a variation in temperature.

The device which was described here above in relation with FIGS. 1 to 8 corresponds to the known device and to its known embodiment variants as disclosed in the patent filing U.S. Pat. No. 6,859,375 already cited above.

Figure 9:
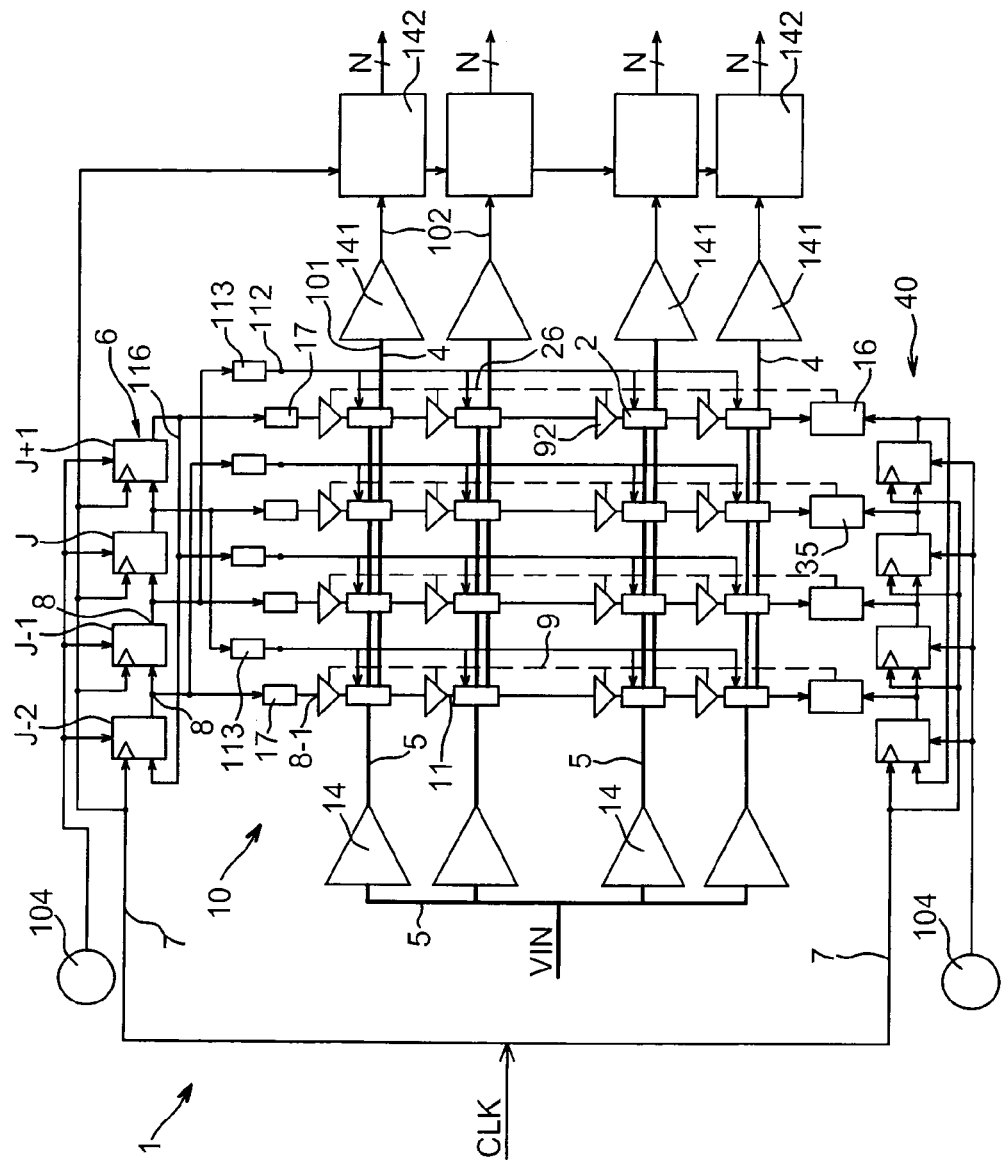
FIG. 9 is a diagrammatic representation of a device comprising with regard to the known device an improvement permitting recording an analog signal and reading it in a continuous way.

An example of a matrix array completed for read-out according to the invention will now be commented in relation with FIG. 9.

This figure represents a matrix array of recording and read-out, of which the recording part can correspond to that represented on the FIGS. 1, 2, 3 and 4.

The elements contributing to the read-out have been specifically highlighted in this drawing. It will be explained below in a more detailed way that cells of a column are all read-out simultaneously, this during the write-in of another column. It will be now explained the meaning of write column and read column. This doesn't designate columns which are different by nature. A same column is successively a write column then a read column and a write column again following a cycle supposed to last as long as write-in and read-out themselves last. Thus when it is talked about a write column, this means one is interested in the writing function of the cells 2 of that column. Now when it is talked about a read column, this means one is interested in the reading function of the cells 2 of that column.

The sampler presented on FIG. 9 comprises means 116, 113 permitting to apply simultaneously to the writing of a column 12 a read command to all the read digital inputs 26 of the cells 2 of a read column 12 which during the reading duration doesn't comprise any cell 2 being written.

By applying simultaneously to the writing of a column 12 a read command to all the read digital inputs of the cells of a read column, one means that the reading duration of the L cells of a read column will be equal to the sampling duration of L cells. The sampling duration of L cells goes from when the first of the L cells samples the signal to when the last of the L cells samples the analog signal to be recorded.

In the example represented, the synchronism is ensured by the fact that each of the inputs 8-1 of each column 12 of cells 2 is coupled through a link 116 comprising preferably a delay 113 to all the read digital inputs 26 of cells 2 of one and only one other column. For instance as represented on FIG. 9, the input 8-1 of the column having the order number j is coupled through a link 116 to all the read digital inputs 26 of the column having the order number (j−2). Generally for a matrix array with C columns, said different column of which read digital inputs 26 are all coupled to the input 8-1 of a column is shifted, modulo c, of k columns in relation to said considered write column. K is an integer number greater than 1, so for instance on FIG. 9 where the array 10 comprises 4 columns, the input 8-1 of the column which has the order number j−2 modulo 4, which is the most upper left column of the figure, is coupled to the cells of the column having the order number j, the latter column being the second one beginning from the right side of the array 10 represented on FIG. 9. The read column is in this example always shifted, modulo 4, of 2 order numbers (k=2) in relation to the write column. Preferably the read digital inputs 26 of a column are each connected to the input 8-1 of another column through a controllable delay 113 having an output 112 located upstream of all the digital inputs 26 of that other column. A same time shift is thus applied between the arrival of the column pointer signal on an output of the shift register 6 and the beginning of the reading of all the cells 2 of the read column. The controllable delays 113 have a control input non-represented permitting, for instance by applying a voltage, to adjust the delays to the desired value.

In a preferred way as represented on FIG. 5, the read digital inputs of the cells 2 are in the number of 2, a first 26a commanding the connection to the hot part 4a of the read bus 4, a second 26b commanding the connection to the cold part 4b of that same read bus 4.

The functioning during read-out is the following: when there is no delay 113 on the link 116 between the column input and the read digital inputs 26, the same column pointer signal arrives simultaneously on the shaping block 17 of the write column and on each of the digital inputs 26 of the cells of the read column. This way while the write column begins being written, the cells 2 of the read column simultaneously begin being read. The reading is initiated by the beginning, for instance a rising edge of the column pointer signal and ends up with the end of the column pointer signal, for instance a falling edge of that same signal. One thus disposes of a duration approximately equal to the period of the clock signal controlling the shift register 6 to read each of the cells 2. It is clear that within an initialization period during which one records the first cells, the cells of the read column designed by the write column through the link 116 are empty. The effective read-out can only begin when k write columns have been recorded. Then writing and reading go on simultaneously with each other. Reading takes place k clock periods after writing. That is why in order to exploit in real-time an analog signal one would best choose k as small as possible. The chronogram of the FIG. 10 displays the example represented FIG. 9, taking into account the requirements of that real-time exploitation in which k=2, and also highlights the interest of delay 113.

Figure 10:
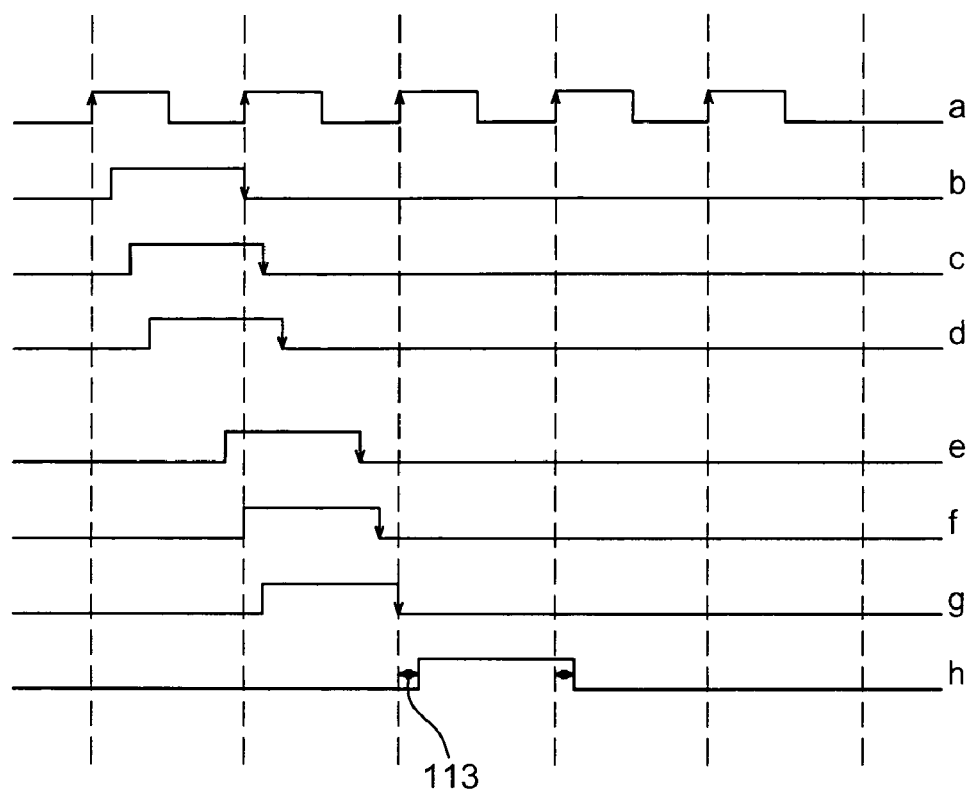
FIG. 10 is a chronogram of different signals. It is aimed at explaining the functioning of the improved device according to the invention and the motives having lead to the embodiment represented on FIG. 9.

The chronogram of FIG. 10 comprises the lines a to h. Line a represents the clock signal at the frequency fp controlling the shift register 6. Lines b to f represent the cell write pointer signal at different instants of its propagation along the cells 2 of a column of rank j. Lines b, c, d represent the recording durations of the cells 2 of the lines 1 to 3 respectively. Lines e and f represent the recording durations of the cells 2 of the lines L-1 and L respectively, that is to say of the second to last and last cells of a column of rank j. The arrow tips mark the sampling times of the analog signals, that is to say the instants when the analog sample capturing ends up. Line g represents the cell write pointer signal applied to the cell 2 of the first line of the column j+1 consecutive to the column j. Line h represents the reading chronology of the column j.

One sees on FIG. 10 that the recording of the cells 2 of the column j is not over when the recording of the cells 2 of the column j+1 begins. It is thus not possible to simultaneously read all the cells 2 of the column j during the recording of the column j+1. On the other hand the recording of the column j is over when the recording of the column j+2 starts. One however sees on the chronogram that the end of recording of the last cell of the column j intervenes only a very short time before beginning of the recording of the column j+2. Thus a small time variation in the recording durations of the cells is sufficient so that the reading of the column j, which coincides with the beginning of the recording of the column j+2, begins while the recording of the last cell of the column j is not over. The controllable delay 113 represented on line h of FIG. 10 in the form of a black rhomb aims at slightly shifting the beginning of the reading of the cells of the column j after the beginning of the recording of the column j+2. It is thus sure that the recording of all the cells of the column j is over when the reading of that same column begins.

Recording which means the beginning of the sample capturing of the column j begins almost simultaneously to the reading of the column j−2. The sampling of the first cell takes place at the end of the duration of the signal at the output of the shaping block 17, thus almost exactly one clock period later. It thus ends up almost exactly 2 clock periods later at the instant when takes place the sampling of the last cell of the column j, whereas ends up the reading of the column j−1. It results from this that almost exactly 2 columns are read during a duration running from the beginning of the recording of the cell of the first row of a column to the end of the recording of the cell of the last row of that same column.

In order for the reading of the read column not to perturb the writing of the write column, it was judged preferable, in that embodiment where the capturing duration of a sample is sensiblement equal to the clock period of the shift register to add a supplementary column in relation to the configuration with 3 columns which from a theoretical point of view is strictly necessary in this case.

So in the preferred embodiment the sampler improved for read-out comprises 4 columns. This number of columns is considered as the smallest and thus the cheapest to produce and the less cumbersome, able to offer a capacity for continuous recording and read-out while presenting a reduced commutation noise and a wide bandwidth.

It was seen above in relation with FIG. 5 that the switch 25 of each read cell 2 is preferably realized in the form of 2 switches 25a and 25b connecting respectively the terminals 22a and 22b of the cell 2 to the terminal 103a and 103b building together the read analog output 103 of said cell, said terminals 103a and 103b being themselves linked respectively to the read hot bus 4a and to the read cold bus 4b.

It was seen above that the invention is particularly well adapted, not only for a continuous read-out but also for an analog to digital continuous conversion. This aspect of the invention will now be explained in conjunction with FIG. 9.

The analog sampler 1 for continuous recording and read-out represented FIG. 9 comprises an analog read bus 4 for each line 13 of the matrix array 10. Each of the L buses 4-1, ... 4-L houses a read amplifier 141. The amplifier 141 has an input coupled to an extremity of each of the divisions 4-1, ... 4-L of the read bus 4, in such a way that the analog data at the output of each cell 2 of a bus division are buffered through the amplifier located on that line.

When the sampler is used in association with ADC, the invention is relative to a digital acquisition system of an analog signal comprising an analog sampler 1 for continuous recording and read-out according to one of the embodiments described above, characterized in that analog to digital converters 142 are coupled univocally at the output of the amplifiers 141. Those ADC are piloted by the same clock or by a clock synchronous to that sequencing the column shift register 6. The delay 113 can also be used to adjust the relative phases of the signals at the output of the amplifiers 141 and of the clock of the ADC 142. It is not mandatory, as represented FIG. 9, that an ADC 142 be coupled at the output of each read amplifier 141. Depending on the sampling frequency required for the specific application aimed at, one will for instance be able to put only one ADC per odd ranking line, thus dividing the sampling frequency by a factor 2.

The invention claimed is:

1. An analog sampler (1) for continuous recording and read-out of analog data relative to a signal comprising:
   at least one write analog bus (5, 5a, 5b) carrying the signal to be recorded;
   at least one read analog bus (4, 4a, 4b) carrying the recorded signal and directing it towards read outputs (101),
   a matrix array (10) for capturing, recording and reading cells (2) arranged in L rows (13) or pairs of lines and C columns (12), L and C designating positive integer numbers, each one of the cells (2) having at least one analog input (3, 3a, 3b) coupled with said at least one write analog bus (5, 5a, 5b), at least one write control digital input (23, 23a, 23b), at least one read control digital input (26, 26a, 26b), and at least one analog output (103, 103a, 103b) linked to the read analog bus (4, 4a, 4b), each of the columns (12) having one column input (8-1) coupled with at least one write digital input (11-1) of each cell (2) of said column (12);
   a shift register (6) having one input (7) for receiving a clock signal, one input (104) to initialize it and a plurality of shifted outputs (8) coupled to the column inputs (8-1) of the matrix array (10);
the sampler comprising for each column (12), an associated delay line (9) having one input (8-1) of the delay line (9) and successive shifted outputs (11) in number equal to or greater than the number L of matrix array rows (13), the input (8-1) of the delay line (9) constituting the column input, the column input (8-1) being coupled with each one of the write digital inputs (11-1) of the column cells (2) by the intermediary of said delay line (9), each output (11) of the delay line being coupled respectively to one of the at least one write digital inputs (11-1) of a cell (2) of said column (12),
   analog sampler (1) characterized in that it comprises means (116, 113) permitting to apply simultaneously to the writing of a column (12) a read command to all the read digital inputs (26) of the cells (2) of a read column, said read column being a column (12) which during its reading duration does not comprise any cell (2) in the course of being written, said means (116, 113) comprising means of synchronization between the arrival of the write column pointer signal on a column input (8-1) and the application of the read command to the read digital inputs (26) of the cells (2) of a read column (12).

2. An analog sampler (1) for continuous recording and read-out of analog data according to claim 1 characterized in that the means (116, 113) applying a read command to all the read digital inputs (26) of the cells (2) of a read column (12) comprise a coupling link (116, 113) between each output (8) of the shift register (6) and each one of the read digital inputs (26, 26a, 26b) of the cells (2) of one and only one read column (12) different from said write column considered.

3. An analog sampler (1) for continuous recording and read-out of analog data according to claim 1 characterized in that said read column is shifted, modulo C, by an integer number k of columns in relation to said column receiving the write column pointer.

4. An analog sampler (1) for continuous recording and read-out of analog data according to claim 3 characterized in that the integer number k is equal to 2.

5. An analog sampler (1) for continuous recording and read-out of analog data according to claim 1 characterized in that the integer number C of columns (12) is equal to 4.

6. An analog sampler (1) for continuous recording and read-out of analog data according to claim 1 characterized in that the means (116, 113) of synchronization between the arrival of the write column pointer signal on a column input (8-1) and the application of the read command to the read digital inputs (26) of the cells (2) of a read column (12) comprise an adjustable delay (113) having the same time shift effect between the output of the write column pointer signal and each one of said read digital inputs.

7. An analog sampler (1) for continuous recording and read-out of analog data according to claim 1 characterized in that the matrix array (10) of recording and read-out cells (2) is folded upon itself, the write shift register (6) comprises a 180 degree bend (63) thus forming an outbound part (61) situated before the bend (63) and a return part (62) situated after the bend (63), columns (12) and their associated delay lines (9) coupled to outputs (8) of the write shift register (6) situated on the return part (62) being intercalated between the columns (12) and their associated delay lines (9) coupled to outputs (8) of the write shift register (6) situated on the outbound part (61).

8. An analog sampler (1) for continuous recording and read-out of analog data according to claim 1 characterized in that each output (8) of the shift register (6) is coupled to the input (8-1) of the delay lines (9) through a pulse shaping block (17).

9. An analog sampler (1) for continuous recording and read-out of analog data according to claim 1 characterized in that the input analog bus (5) is divided for supplying divisions (5-1, ... 5-L), each division corresponding to a row (13) of the matrix array (10), and each of the divisions (5-1, ... 5-L) housing a follower amplifier (14).

10. An analog sampler (1) for continuous recording and read-out of analog data according to claim 9 characterized in that each cell (2) of the array comprises a capacitor (22) having two terminals a first (22a) and a second (22b), the first terminal (22a) being coupled through a first write controllable switch (21a) belonging to write commutation means (21) to a division (5-1, 5-2, ... 5L) of the write bus (5) and through a first read controllable switch (25a) belonging to read commutation means (25) to a division (4-1, 4-2, ... 4L) of the read bus (4), the second terminal (22b) being coupled through a second write controllable switch (21b) belonging to said write commutation means (21), to a return part (5b) of the write bus (5) at a constant voltage, a command (23a, 23b) of each of those write switches (21a, 21b) being coupled to write digital inputs of each of the cells (2), and through a second read controllable switch (25b) belonging to said read commutation means (25), to a return part (4b) of the read bus (4) at a constant voltage, a command (26a, 26b) of each of those read switches (25a, 25b) being coupled to read digital inputs of each of the cells (2).

11. An Analog sampler (1) for continuous recording and read-out according to claim 10 characterized in that the second write switch (21b) belonging to said write commutation means (21) of each cell (2) has its control input connected to an elementary delay or to an elementary half-delay of the delay line (9) which is located upstream of an output of an elementary delay (92) or elementary half-delay (93, 94) to which is connected a write control input of the first switch (21a) belonging to said write commutation means (21).

12. Analog sampler (1) with continuous recording and read-out of analog data according to claim 10 characterized in that the first write switch (21a) belonging to said write commutation means (21) is composed of two transistors connected in parallel, one transistor NMOS and one transistor PMOS.

13. An analog sampler (1) for continuous recording and read-out of analog data according to claim 1 characterized in that each delay line (9) is formed of a succession of elementary delays (92) at a rate of one elementary delay per matrix array row (13), at least one digital output of each elementary delay (92) being coupled to a write digital input of a cell (2).

14. An analog sampler (1) for continuous recording and read-out of analog data according to claim 13 characterized in that each elementary delay (92) is formed of two elementary half-delays (93, 94) placed in series, a first (93) and a second (94) each elementary half-delay (93, 94) having an output coupled to a write digital input (11-1a, 11-1b) of a cell (2).

15. An analog sampler (1) for continuous recording and read-out of analog data according to claim 13 characterized in that it comprises at least for one delay line (9) associated with a column (12) or for a supplemental delay line (91), a phase comparator (30) receiving on a first input (18) a signal from said delay line (9, 91) and on a second input (19) a reference signal, one output of said phase comparator (30) being coupled to a charge pump (32) of which at least one output (33) is coupled to means controlling a regulation voltage of the elementary delays (92).

16. An analog sampler (1) for continuous recording and read-out of analog data according to claim 13 characterized in that it comprises for each delay line (9) associated with a column (12) a phase comparator (30) receiving on a first input (18) a signal from said delay line (9) and on a second input (19) a reference signal, an output of said phase comparator (30) being coupled to a charge pump (32) of which at least one output (33) is coupled to means controlling a regulation voltage of the elementary delays (92) of said delay line (9).

17. Analog sampler (1) for continuous recording and read-out of analog data according to claim 1 characterized in that it comprises two analog input buses, a first aimed at being connected to one source of the signal to be sampled at a first polarity, a second aimed at being connected to a polarity inverter receiving the signal to be sampled and delivering a signal to be sampled at a second polarity opposite to the first one, both analog input buses being divided in order to feed divisions, each division corresponding to a row of the matrix array and each of these divisions housing a follower amplifier (14), the rows being arranged in pairs of lines, each pair of lines comprising an odd ranking line of the matrix array and an even ranking line of the matrix array, the lines of a pair having consecutive ranks, each odd-ranking line having its cells coupled to a division of the bus carrying the signal of the first polarity and each even ranking line having its cells coupled to a division of the bus carrying the signal of the second polarity.

18. Analog sampler (1) for continuous recording and read-out of analog data according to claim 1 characterized in that it comprises a read analog bus (4) per line (13) of the matrix array (10), each of these L buses (4-1, ... 4-L) housing a read amplifier (141).

19. Digital acquisition system of an analog signal comprising an analog sampler (1) for continuous recording and read-out of analog data according to claim 18 characterized in that read amplifiers (141) are each coupled univocally to an analog to digital converter (142).

20. Digital acquisition system of an analog signal comprising an analog sampler (1) for continuous recording and read-out of analog data according to claim 19 characterized in that each of the analog to digital converters (142) has a clock input connected to a common terminal, itself coupled to the clock input of the shift register (6).

21. Process for continuous recording and read-out of analog data relative to a signal thanks to an analog sampler (1) according to claim 1, characterized in that during the clock period corresponding to the successive sampling of the L cells of a write column, the L cells of a read column previously recorded are read-out simultaneously, said read-out being synchronized with the sampling in the write column.

22. Process according to claim 21 for continuous recording and read-out of analog data relative to an analog signal thanks to an analog sampler (1) according to claim 1 characterized in that the write contacts of each cell are controlled by a cell write pointer signal having a rising edge and a falling edge built from a column pointer signal present in the shift register (6), and in that the rising and falling edges of the cell write pointer signal control one the beginning of the sample capturing, the other the end of the sample capturing, and in that the duration separating the rising and falling edges of the cell write pointer signal is slightly shorter than the clock period controlling the shift register (6).

23. Process according to claim 21 for continuous recording and read-out of analog data relative to a signal characterized in that the edge of the pulse controlling the end of the sample capturing of a cell first controls a digital input opening a contact of said recording cell with the return bus, second after a time delay a digital input opening a contact of the recording cell with the bus carrying the signal.

24. Process of continuous analog to digital conversion of an analog signal consisting in comprising sampling and recording sequentially said analog signal in cells of a column j of a matrix array comprising C columns of cells and, when the recording of all the cells of said column j is over, in presenting to analog to digital converters simultaneously and during a time corresponding to the duration of the writing of a column each of the samples recorded in the cells of that same column j, whereas one goes on recording sequentially said analog signal in the cells of columns different from said column j.

* * * * *